(12) United States Patent
Kerber

(10) Patent No.: US 8,823,385 B2
(45) Date of Patent: Sep. 2, 2014

(54) DETECTION OF PRE-CATASTROPHIC, STRESS INDUCED LEAKAGE CURRENT CONDITIONS FOR DIELECTRIC LAYERS

(75) Inventor: Martin Kerber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 709 days.

(21) Appl. No.: 13/044,827

(22) Filed: Mar. 10, 2011

(65) Prior Publication Data

US 2012/0229145 A1 Sep. 13, 2012

(51) Int. Cl.
*G01R 31/02* (2006.01)

(52) U.S. Cl.
USPC ............... 324/537; 324/762.05; 324/754.28; 438/14; 438/17; 702/58

(58) Field of Classification Search
USPC .......................................... 324/537
See application file for complete search history.

(56) References Cited

U.S. PATENT DOCUMENTS

| | | | | |
|---|---|---|---|---|
| 4,399,324 A * | 8/1983 | Ishida et al. | ................... | 381/3 |
| 5,521,548 A * | 5/1996 | Sugawara | ................... | 329/306 |
| 6,043,102 A * | 3/2000 | Fang et al. | ................... | 438/14 |
| 6,047,243 A * | 4/2000 | Bang et al. | ................... | 702/58 |
| 6,147,507 A * | 11/2000 | Shabde et al. | ........... | 324/754.27 |
| 6,255,842 B1 * | 7/2001 | Hashimoto | ................ | 324/76.11 |
| 6,538,462 B1 * | 3/2003 | Lagowski et al. | ........ | 324/762.05 |
| 6,734,028 B1 * | 5/2004 | Yang et al. | ................... | 438/17 |
| 7,295,022 B2 * | 11/2007 | Hillard et al. | ........... | 324/754.28 |
| 8,130,032 B1 * | 3/2012 | Heaton et al. | ................. | 330/2 |
| 8,354,671 B1 * | 1/2013 | Im et al. | ................... | 257/48 |
| 2003/0183885 A1 * | 10/2003 | Nishikawa et al. | ........... | 257/410 |
| 2004/0077110 A1 * | 4/2004 | Kang et al. | ................... | 438/14 |
| 2005/0040840 A1 * | 2/2005 | Kang et al. | ................... | 324/765 |
| 2006/0115910 A1 * | 6/2006 | Okada | ................... | 438/17 |
| 2007/0018231 A1 | 1/2007 | Mitani et al. | | |
| 2007/0046310 A1 * | 3/2007 | Hillard et al. | ................. | 324/765 |
| 2008/0042681 A1 * | 2/2008 | Kerber | ................... | 324/765 |
| 2008/0048332 A1 * | 2/2008 | Park | ................... | 257/773 |
| 2008/0174334 A1 * | 7/2008 | Chanda et al. | ................. | 324/765 |
| 2009/0172614 A1 * | 7/2009 | Camara et al. | ................. | 716/5 |
| 2010/0117676 A1 * | 5/2010 | Yiang et al. | ................... | 324/765 |
| 2010/0134125 A1 * | 6/2010 | Aubel et al. | ................. | 324/719 |
| 2010/0332812 A1 * | 12/2010 | Burger et al. | ................. | 712/239 |
| 2011/0215827 A1 * | 9/2011 | Mohammad et al. | .... | 324/762.09 |
| 2012/0019263 A1 * | 1/2012 | Marshall et al. | ............. | 324/658 |
| 2012/0229145 A1 * | 9/2012 | Kerber | ................... | 324/537 |

OTHER PUBLICATIONS

Park, Donggun, et al., "Stress-Induced Leakage Current Due to Charging Damage: Gate Oxide Thickness and Gate Poly-Si Etching Condition Dependence", 1998 3rd International Symposium on Plasma Process-Induced Damage, Jun. 4-5, 1998, p. 56-59.

(Continued)

*Primary Examiner* — Benjamin M Baldridge
(74) *Attorney, Agent, or Firm* — Eschweiler & Associates, LLC

(57) ABSTRACT

Techniques disclosed herein stress a dielectric layer until a pre-catastrophic, stress induced leakage current (SILC) condition is detected. When the pre-catastrophic SILC condition is detected, the stress is removed to prevent catastrophic failure of the dielectric and its associated device. Because these techniques prevent catastrophic failure of the dielectric layer, engineers can carry out physical failure analysis of the device, which is now known to have some type of defect due to detection of the pre-catastrophic SILC condition. In this way, the techniques disclosed herein allow engineers to more quickly determine an underlying cause of a defect so that yields can be kept at optimal levels.

24 Claims, 4 Drawing Sheets

(56) References Cited

OTHER PUBLICATIONS

Kang, Ting-Kuo, et al., "Numerical Confirmation of Inelastic Trap-Assisted Tunneling (ITAT as SILC Mechanism", IEEE Transactions on Electron Devices, vol. 48, No. 10, Oct. 2001, p. 2317-2322.

T. Pompl, et al., "Gate Voltage and Oxide Thickness Dependence of Progressive Wear-Out of Ultra-Thin Gate Oxides", Microelectronics Reliability 46, www.elsevier.com/locate/microrel, 2006, 1603-1607.

M. Roehner, et al., "Voltage Acceleration of TBD and its Correlation to Post Breakdown Conductivity of N- and P-channel MOSFETs", IEEE 44th Annual International Reliability Physics Symposium, 2006, p. 76-81.

Stathis, James H., "Physical and Predictive Models of Ultrathin Oxide Reliability in CMOS Devices and Circuits", IEEE Transactions on Device and Materials Reliability, vol. 1, No. 1, Mar. 2001, p. 43-59.

* cited by examiner

DETECTION OF PRE-CATASTROPHIC, STRESS INDUCED LEAKAGE CURRENT CONDITIONS FOR DIELECTRIC LAYERS

BACKGROUND

In electronics, an integrated circuit (also known as an IC, chip, or microchip) is a miniaturized electronic circuit typically consisting of semiconductor devices and/or passive components. Integrated circuits are used in almost all electronic equipment in use today and have revolutionized the world of electronics. Computers, cellular phones, and other digital appliances are now inextricable parts of modern societies, made possible by the low cost of production of integrated circuits.

Due to the small feature sizes of semiconductor devices on ICs, it is critical to keep extremely tight tolerances during the fabrication process. For example, great lengths are taken to ensure that dielectric layers, such as gate oxides in transistors or dielectrics between plates of on-chip capacitors, have uniform thickness and conductivity. Defects and imperfections in these dielectric layers can result in a device not operating as planned over a predetermined operating range, or can even result in device failure. For example, weak spots, local contamination, unwanted residues, pre-damage by plasma enhanced processing steps, and so forth, can adversely affect a dielectric layer and ultimately reduce the life time of a device.

In an attempt to keep dielectric layers (and gate oxides in particular) uniform, high voltage tests are performed at various points in conventional fabrication processes. The goal of these tests is to identify any dielectric layer defects through abnormal device operation or device failure. If dielectric defects are found, engineers study the fabrication process to identify the underlying cause of the defect so it can be remedied as quickly as possible.

Unfortunately, however, until now direct physical failure analysis of a defective dielectric has been difficult, if not impossible, because conventional high voltage tests cause device failure by destroying the physical structure of the dielectric layer. For example, in many instances the high voltage tests cause thermal runaway of current over the device, which melts the dielectric and other nearby regions. Hence, physical analysis of the defective device and its dielectric (e.g. identifying chemical contaminants or the presence of micro cracks) has been difficult or impossible until now, because the original device structure is changed as a result of the catastrophic failure.

DETAILED DESCRIPTION

Figure 1:
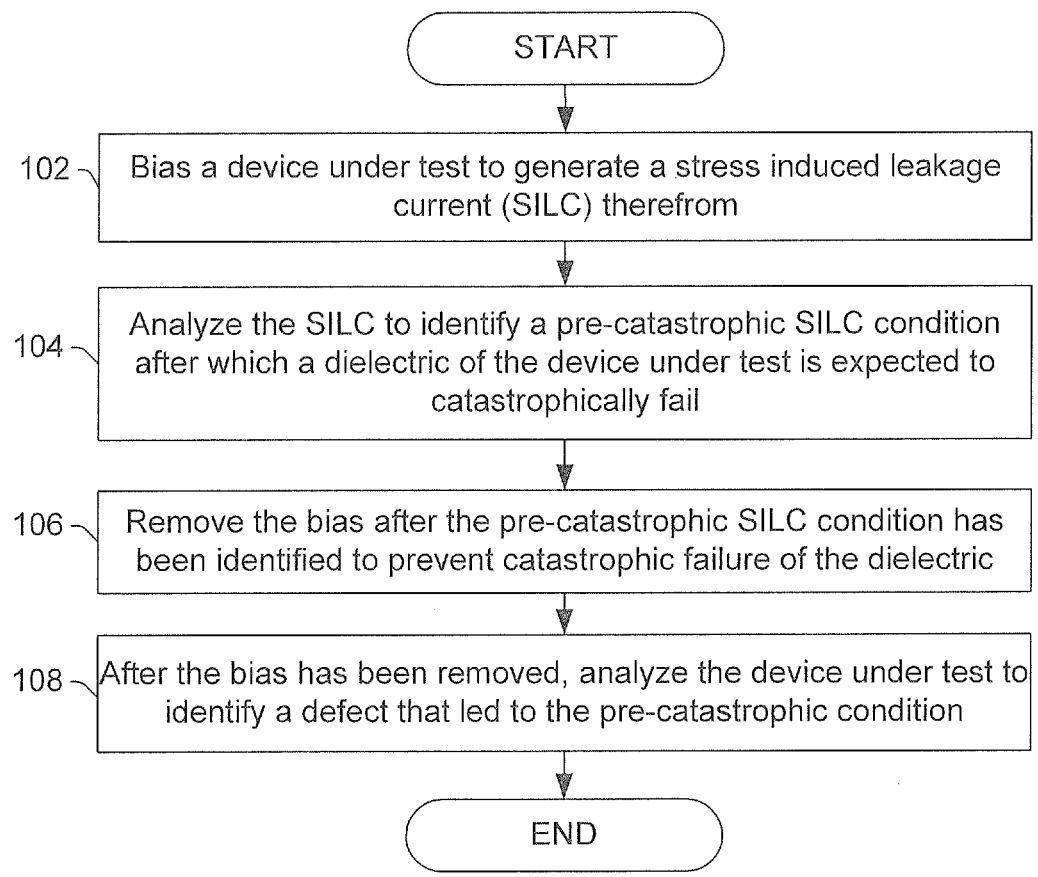
FIG. 1 is a flow chart depicting a method in accordance with some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Techniques disclosed herein stress a dielectric layer until a pre-catastrophic, stress induced leakage current (SILC) condition is detected. When the pre-catastrophic SILC condition is detected, the stress is removed to prevent catastrophic failure of the dielectric and its associated device. Because these techniques prevent catastrophic failure of the dielectric layer, engineers can carry out physical failure analysis of the device, which is now known to have some type of defect due to detection of the pre-catastrophic SILC condition. In this way, the techniques disclosed herein allow engineers to more quickly determine an underlying cause of a defect so that yields can be kept at optimal levels.

FIG. 1 shows one method 100 in accordance with these techniques. At 102, a device under test is biased to generate a stress induced leakage current (SILC) there from. At 104, the SILC is analyzed to identify a pre-catastrophic SILC condition after which a dielectric of the device under test is expected to catastrophically fail. At 106, after the pre-catastrophic SILC condition has been identified, the bias is removed to prevent catastrophic failure of the dielectric. In 108, after the bias has been removed, the device under test can be analyzed (e.g., by using photo emission microscopy or a scanning electron microscope) to identify a defect that led to the pre-catastrophic condition. In contrast with conventional high voltage testing methods used to identify dielectric defects, which were destructive to the device, the method 100 removes the bias from the device under test just prior to dielectric failure, such that the method 100 allows subsequent physical evaluation of the device itself to help pinpoint the cause of the imminent dielectric failure. For example, physical failure analysis methods can be used to identify thin regions of dielectric, chemical contaminants in or on the dielectric, broken atomic bindings, edge residues and so forth directly in the device.

Figure 2:
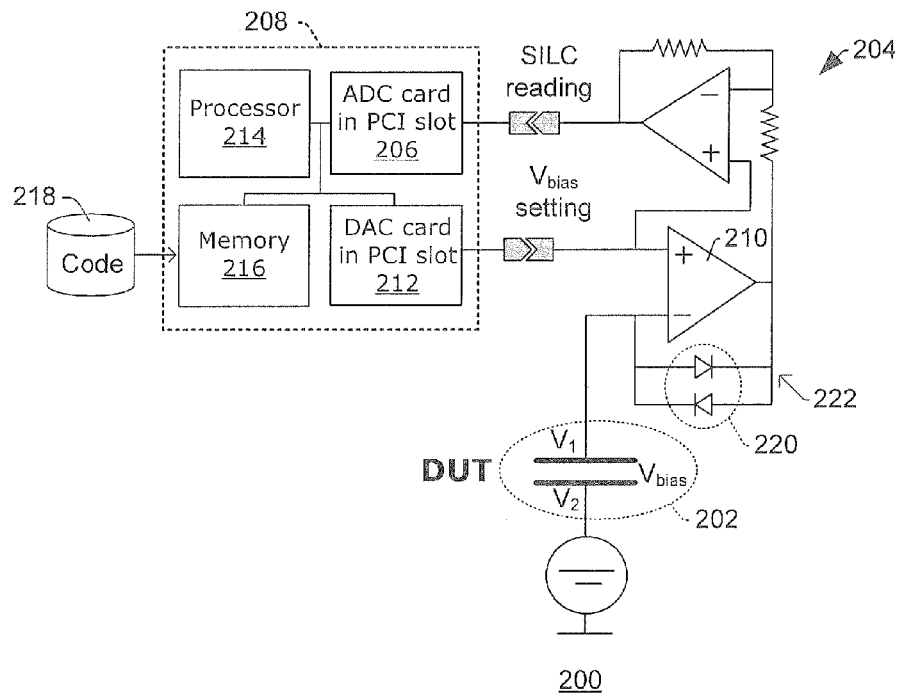
FIG. 2 is a block diagram illustrating a testing apparatus in accordance with some embodiments.

FIG. 2 shows a test apparatus 200 in accordance with some embodiments. The test apparatus 200 is adapted to apply a voltage bias to a device under test 202 (e.g., a transistor or a capacitor), thereby providing a stress induced leakage current (SILC) from the device under test 202. The test apparatus 200 then monitors the SILC for a pre-catastrophic condition, and removes the bias when the pre-catastrophic condition is detected. In this example, the test apparatus 200 includes a logarithmic current to voltage converter 204, and an analog to digital converter 206 as operated in a PCI slot of a computer 208. The bias voltage, or reference input voltage for an operational amplifier 210 can be provided to a digital to analog converter 212 plugged into a PCI slot. To help to ensure the appropriate voltage bias and current flow conditions are achieved with respect to the device under test 202, the computer 208 includes a processor 214 and memory 216, wherein the memory 216 stores computer executable instructions 218 to apply desired biases and react appropriately to measured stress-induced leakage current. A pair of diodes 220 can be disposed on a feedback back 222 of the test apparatus 200 to realize the logarithmic characteristics of the current to voltage converter circuit 204.

Figures 3A, 3B:
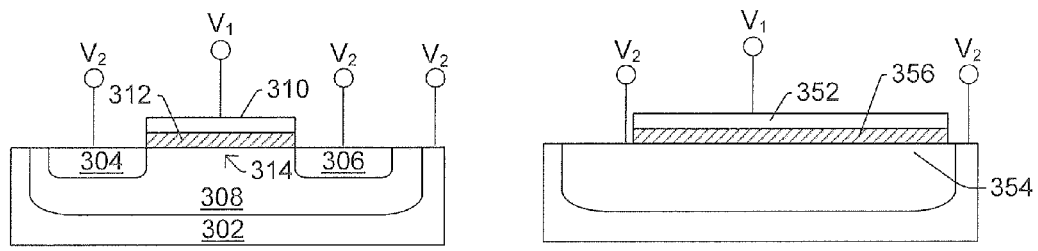
FIGS. 3A-3B illustrate example devices that can be placed under test in the testing apparatus of FIG. 2.

FIGS. 3A-3B show two example devices that can be included as a device under test (e.g., device under test 202 in FIG. 2). FIG. 3A depicts a transistor 300 formed on a semiconductor substrate 302. A source region 304, a drain region 306, and a well region 308 can be formed in the semiconductor substrate 302. For example, in some embodiments the substrate 302 is p-type silicon substrate (e.g., P−), the well region 308 is n-type material (e.g., N+), and the source and drain regions 304, 306 are p-type material (e.g., P++), although these doping conventions could also be reversed. A gate electrode 310, which is often made of metal or polysilicon, is formed in or over the semiconductor substrate 302. A gate oxide 312, which can have a thickness of greater than 5 nanometers (nm), for example, is disposed between the semiconductor substrate 302 and the gate electrode 310. To test the gate oxide 312 for defects, a testing apparatus (e.g., 200 of FIG. 2) applies a bias over the gate oxide by applying a first voltage V1 to the gate electrode 310 and a second voltage V2 to the substrate 302, source 304, drain 306, well 308. Depending on the implementation, the bias voltage can be a constant voltage or a ramped voltage. Often, the first voltage V1 is greater than a threshold voltage of the transistor, thereby freeing charged carriers from a channel region 314 under the gate electrode 310. These carriers can tunnel or "leak" from the substrate 302, through the gate oxide 312, and into the gate electrode 310 (or in the opposite direction), resulting in a stress induced gate leakage current. As will be appreciated in more detail herein, this stress induced gate leakage current can be evaluated to identify a pre-catastrophic failure current condition for the gate dielectric.

FIG. 3B depicts a capacitor 350, which can also be included as a device under test in FIG. 2. The capacitor 350 includes first and second conductive plates 352, 354 having a dielectric 356 disposed there between. In some embodiments, the dielectric 356 has a thickness of greater than 5 nm. In FIG. 3B's embodiment, the first plate 352 takes the form of a polysilicon or metal layer and the second plate 354 takes the form of a semiconductor substrate. However, in other embodiments, a capacitor can have at least one, if not both plates, formed in an upper metal layer. For example, a capacitor could be formed by a polysilicon layer and an upper metal layer or between two upper metal layers. It will be appreciated that capacitors in accordance with this disclosure can also include multiple (e.g., 3 or more) conductive layers. To test a capacitor dielectric (e.g., 356) for defects, a testing apparatus (e.g., 200 of FIG. 2) applies a bias over the dielectric by applying a first voltage to the first plate and a second voltage to the second plate. Depending on the implementation, the bias voltage can be a constant voltage or a ramped voltage. Carriers can tunnel or "leak" from one plate to the other though the dielectric, resulting in a stress induced gate leakage current flowing over the capacitor dielectric. As will be appreciated in more detail herein, this stress induced leakage current can be evaluated to identify a pre-catastrophic failure current condition for the dielectric.

Figure 4:
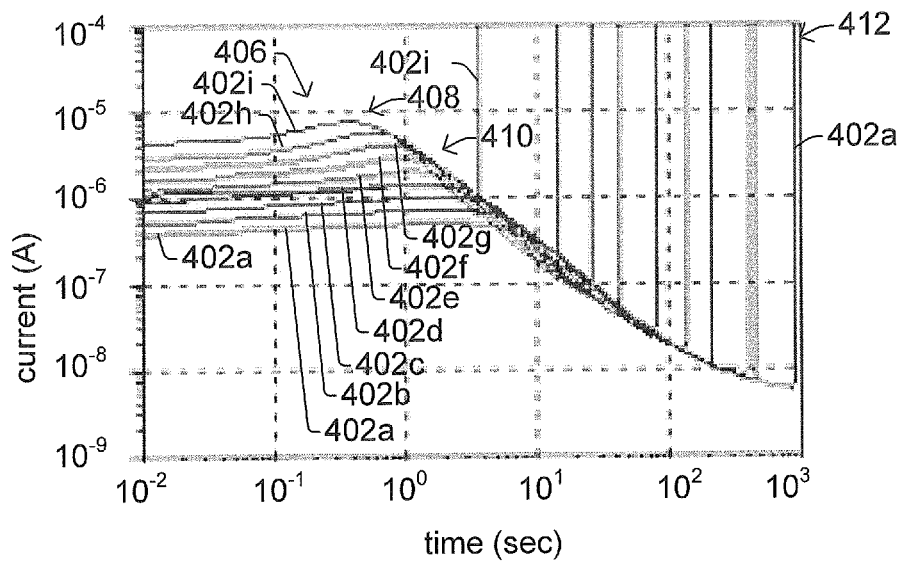
FIG. 4 is a waveform diagram illustrating a series of stress induced leakage currents over time.

Turning now to FIG. 4, one can see a series of waveforms 402a-402i showing stress-induced gate leakage current versus time for an n-type transistor device having a gate oxide thickness of approximately 15 nm. The waveforms collectively show how stress-induced gate leakage current from the transistor changes in time at various voltages ranging from 19.0V to 21.0V, in increments of 0.25V, at 85° C. For example, curve 402a represents the stress induced leakage gate current while a constant 19.0V gate voltage is continuously applied, and curve 402i represents the stress induced leakage gate current while a constant 21.0V gate voltage is continuously applied.

During a first time period 406, the SILC increases at a first rate, after which the SILC transitions through an inflection point 408 and thereafter decreases at a second rate during a second time period 410. Shortly after this SILC decrease during time period 410, the SILC current shows a sudden spike (e.g., at 412). This sudden current spike, if encountered, can correspond to a catastrophic failure or breakdown of the gate oxide dielectric, resulting in melting and re-crystallization of the dielectric and its nearby regions. As previously mentioned, it would be advantageous to avoid such a catastrophic failure just before it occurs, so that the underlying dielectric defect can be analyzed by physical analysis techniques.

Figure 5:
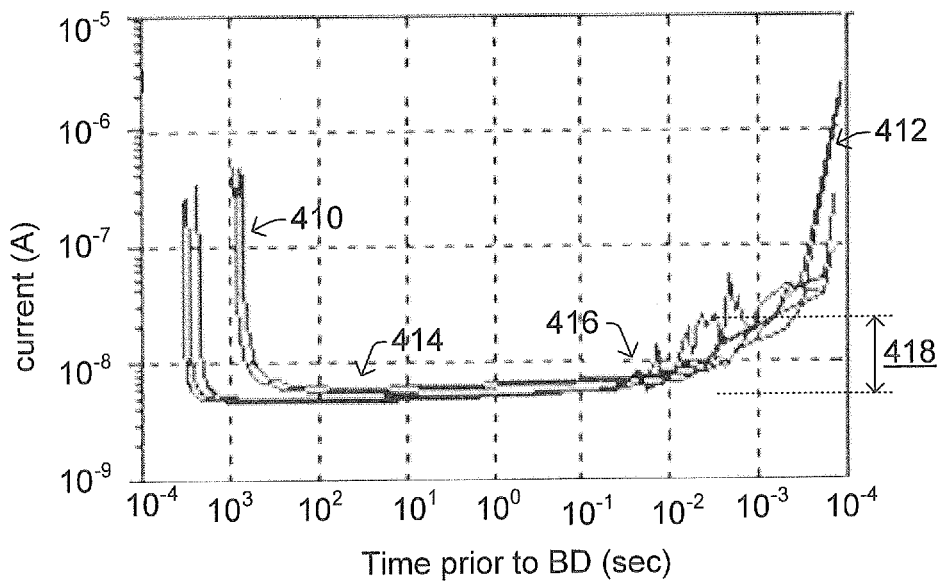
FIG. 5 is another waveform diagram illustrating a series of stress induced leakage currents over time and which exhibit a pre-catastrophic, stress induced leakage current condition.

With that in mind, FIG. 5 shows a more detailed of FIG. 4's waveform. Note that the time in FIG. 5 is expressed in time prior to breakdown (BD) rather than elapsed time as shown in FIG. 4, such that right-most portion of FIG. 5 shows a "zoomed in" timescale not readily discernable in FIG. 4. As shown, after the second time period 410 (in which SILC is decreasing) expires, the SILC reaches a base level during a third time period 414. This base SILC level of approximately 3 nA in this example is given by diodes (e.g., 214 in FIG. 2) in a feedback loop of a logarithmic current to voltage converter biasing the transistor. At time 416, which is approximately 10 ms before catastrophic failure occurs in this example, the SILC begins to increase to indicate a pre-catastrophic condition. To detect this pre-catastrophic condition, the techniques disclosed herein can compare the SILC during this increase to a predetermined threshold 418. If the SILC during this increase is greater than the predetermined threshold 418, the method determines a pre-catastrophic condition is occurring and therefore removes the bias from the device under test before catastrophic failure actually occurs.

It will be appreciated that the waveforms of FIG. 4-5 are merely one example of waveforms covered by the present disclosure. Other waveforms in which pre-catastrophic SILC current conditions are detected may deviate significantly from those illustrated. For example, in other implementations, the SILC from a device under test can start immediately at base level 414 of FIG. 5 without going through regions 402 and 410. Further, in some respects, prior to the pre-catastrophic current condition at 416, the SILC can be thought of as a background/reference leakage current (e.g., Fowler Nordheim tunneling during 414). Thus, the pre-catastrophic SILC condition at 416 can be thought of as an additional current that is localized in an defective dielectric area, wherein the pre-catastrophic SILC condition is in addition to the background leakage current.

Figure 6:
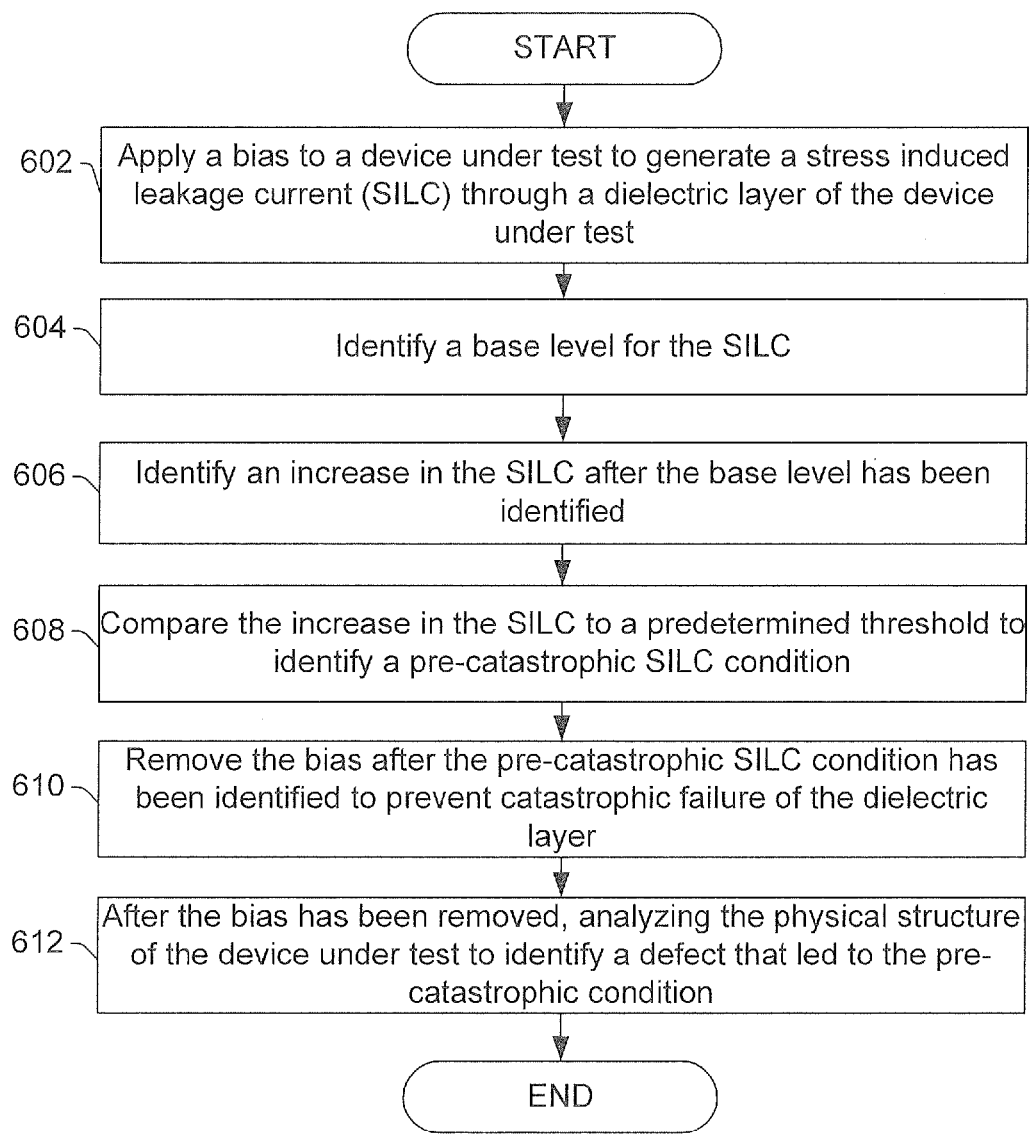
FIG. 6 is a flow chart depicting a method in accordance with some embodiments.

FIG. 6 shows another method 600 in accordance with some embodiments. It will be appreciated that, while the methods illustrated and described herein may be expressed as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required. Further, one or more of the acts depicted herein may be carried out in one or more separate acts or phases.

The method starts at 602, when a bias is applied to a device under test, such as a transistor or capacitor for example. The bias generate a stress induced leakage current (SILC) through a dielectric layer of the device under test.

At 604, the method identifies a base level for the SILC. See e.g., base level 414 in FIG. 4.

At 606, the method identifies an increase in the SILC after the base level has been identified.

At 608, the method compares the increase in the SILC to a predetermined threshold to identify a pre-catastrophic SILC condition.

In 610, after the pre-catastrophic SILC condition has been identified, the bias is removed to prevent catastrophic failure of the dielectric layer.

In 612, after the bias has been removed, the physical structure of the device under test can be analyzed to identify a defect that led to the pre-catastrophic condition. For example, electron microscopy can be used to evaluate the physical structure of the device to better identify defects. After a defect has been found, the fabrication process can be analyzed to isolate which stage of the process has caused the defect, thereby allowing the defect to be prevented for future devices.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A method of testing a dielectric layer of a device under test, comprising:
    applying a bias to the device under test to generate a stress induced leakage current (SILC) therefrom;
    analyzing the SILC during the application of the bias to the device under test and identifying a pre-catastrophic SILC condition of the dielectric layer indicated by a measured SILC level, wherein the dielectric layer of the device under test is expected to catastrophically fail in less than one minute immediately after identification of the pre-catastrophic SILC condition if the bias were continued to be applied;
    removing the bias less than one minute after the pre-catastrophic SILC condition has been identified to prevent catastrophic failure of the dielectric layer.

2. The method of claim 1, wherein analyzing the SILC to identify the pre-catastrophic SILC condition comprises:
    while the bias is applied, identifying a base level for the SILC prior to the pre-catastrophic SILC condition; and
    identifying an increase in the SILC while the bias is applied after the base level has been identified; and
    comparing the increase in the SILC to a predetermined current threshold to identify the pre-catastrophic SILC condition.

3. The method of claim 2, wherein a logarithmic current to voltage converter biases the device under test, and wherein the base level is set by passive components in a feedback loop of the logarithmic current to voltage converter.

4. The method of claim 3, wherein the passive components are diodes.

5. The method of claim 1, further comprising:
    after the bias has been removed, analyzing the device under test to identify a defect that led to the pre-catastrophic SILC condition.

6. The method of claim 5, wherein analyzing the device under test comprises using photo emission microscopy or a scanning electron microscope to analyze structural features of the device to determine the cause of the pre-catastrophic SILC condition.

7. The method of claim 1, wherein analyzing the SILC to identify the pre-catastrophic SILC condition comprises:
    monitoring the SILC during a first time period in which the SILC increases at a first rate;
    monitoring the SILC during a second time period following the first time period, wherein the SILC decreases at a second rate during the second time period;
    monitoring the SILC during a third time period following the second time period, wherein the SILC is at a base level during the third period;
    identifying an increase in the SILC after the base level has been identified; and
    comparing the increase to a predetermined threshold to identify the pre-catastrophic SILC condition.

8. The method of claim 1, wherein the device under test comprises a transistor, comprising:
    a semiconductor substrate;
    a gate electrode formed in or over the semiconductor substrate;
    wherein the dielectric is a gate oxide disposed between the semiconductor substrate and the gate electrode.

9. The method of claim 8, wherein the gate oxide has a thickness of greater than 5 nanometers.

10. The method of claim 8, wherein biasing the transistor comprises:
    applying a constant voltage bias across the gate electrode and the substrate to generate a stress induced gate leakage current from the transistor,
    wherein the constant voltage bias is greater than a threshold voltage of the transistor.

11. The method of claim 1, wherein the device under test comprises a capacitor comprising:
    a first conductive plate; and
    a second conductive plate that is electrically separated from the first conductive plate;
    wherein the dielectric is a dielectric disposed between the first and second conductive plates.

12. The method of claim 11, wherein the dielectric has a thickness of greater than 5 nanometers.

13. The method of claim 1, wherein the bias applied to the device under test is a constant voltage bias.

14. The method of claim 1, wherein the bias applied to the device under test is a ramped voltage bias.

15. A method of testing a dielectric layer of a device under test, comprising:
    applying a bias to the device under test, to generate a stress induced leakage current (SILC) through the dielectric layer;
    identifying a base level for the SILC while the bias is applied;
    identifying an increase in the SILC while the bias is applied after the base level has been identified; and
    comparing the increase in the SILC to a predetermined current threshold to identify a pre-catastrophic SILC condition;
    removing the bias less than one minute after the pre-catastrophic SILC condition has been identified to prevent catastrophic failure of the dielectric.

16. The method of claim 15, further comprising:
after the bias has been removed, analyzing the physical structure of the device under test to identify a defect that led to the pre-catastrophic condition.

17. A test apparatus, comprising:
a current to voltage converter coupled to a device under test, wherein the device under test includes a dielectric layer;
a processor coupled to the current to voltage converter; and
a memory to store operating instructions to be executed by the processor and thereby induce operational changes in the current to voltage converter,
wherein the instructions stored in memory cause the current to voltage converter to apply a bias to the device under test to generate a stress induced leakage current (SILC) from the device under test and analyze the SILC to identify a base current level for the SILC, to identify an increase in the SILC while the bias is applied, and to compare the increase in the SILC to a predetermined current threshold to identify a pre-catastrophic SILC condition after which a dielectric layer of the device under test is expected to catastrophically fail, and to remove the bias less than one minute after the pre-catastrophic SILC condition has been identified to prevent catastrophic failure of the dielectric layer.

18. The test apparatus of claim 17, wherein the instructions are configured to selectively remove the bias based on whether the pre-catastrophic SILC condition has been identified.

19. The test apparatus of claim 17, wherein the device under test comprises a transistor, comprising:
a semiconductor substrate;
a gate electrode formed in or over the semiconductor substrate;
wherein the dielectric is a gate oxide disposed between the semiconductor substrate and the gate electrode.

20. The test apparatus of claim 17, wherein the device under test comprises a capacitor comprising:
a first conductive plate; and
a second conductive plate that is electrically separated from the first conductive plate;
wherein the dielectric is a dielectric disposed between the first and second conductive plates.

21. A method of testing a dielectric layer of a device under test, comprising:
applying a bias to a device under test to generate a stress induced leakage current (SILC) therefrom;
analyzing the SILC to identify a pre-catastrophic SILC condition after which a dielectric of the device under test is expected to catastrophically fail; and
removing the bias less than one minute after the pre-catastrophic SILC condition has been identified to prevent catastrophic failure of the dielectric;
wherein analyzing the SILC to identify the pre-catastrophic SILC condition comprises:
monitoring the SILC during a first time period in which the SILC increases at a first rate;
monitoring the SILC during a second time period following the first time period, wherein the SILC decreases at a second rate during the second time period;
monitoring the SILC during a third time period following the second time period, wherein the SILC is at a base level during the third period;
identifying an increase in the SILC after the base level has been identified; and
comparing the increased SILC to a predetermined current threshold to identify the pre-catastrophic SILC condition.

22. The method of claim 1, wherein the device under test is expected to catastrophically fail in less than ten seconds immediately after identification of the pre-catastrophic SILC condition if the bias were continued to be applied.

23. The method of claim 1, wherein the device under test is expected to catastrophically fail in less than one second immediately after identification of the pre-catastrophic SILC condition if the bias were continued to be applied.

24. The method of claim 1, wherein the device under test is expected to catastrophically fail in less than one hundredth of a second immediately after identification of the pre-catastrophic SILC condition if the bias were continued to be applied.

* * * * *